(12) United States Patent
Rossi

(10) Patent No.: US 12,438,458 B1
(45) Date of Patent: Oct. 7, 2025

(54) POWER SUPPLY WITH VACUUM DIODE

(71) Applicant: Andrea Rossi, Miami Beach, FL (US)

(72) Inventor: Andrea Rossi, Miami Beach, FL (US)

( * ) Notice: Subject to any disclaimer, the term of this patent is extended or adjusted under 35 U.S.C. 154(b) by 0 days.

(21) Appl. No.: 19/096,905

(22) Filed: Apr. 1, 2025

(51) Int. Cl.
  *H02M 3/155* (2006.01)

(52) U.S. Cl.
  CPC ................... *H02M 3/155* (2013.01)

(58) Field of Classification Search
  CPC ....................................................... H03K 3/371
  See application file for complete search history.

(56) References Cited

U.S. PATENT DOCUMENTS

| | | | | |
|---|---|---|---|---|
| 1,778,796 A * | 10/1930 | Craig | | H03F 15/00 |
| | | | | 33/300 |
| 2,456,754 A * | 12/1948 | Sziklai | | H02M 3/24 |
| | | | | 307/106 |
| 2,490,026 A * | 12/1949 | Buckbee | | H03K 7/08 |
| | | | | 332/111 |
| 2,749,474 A * | 6/1956 | Preisig | | H04N 9/28 |
| | | | | 315/411 |
| 2,820,894 A * | 1/1958 | Schrecongost | | H03K 4/43 |
| | | | | 327/140 |
| 2,824,230 A * | 2/1958 | Fathauer | | H03K 4/32 |
| | | | | 315/404 |
| 2,854,630 A * | 9/1958 | Fogelberg, Jr. | | G01R 19/04 |
| | | | | 327/590 |
| 2,919,372 A * | 12/1959 | Goldberg | | H01J 17/56 |
| | | | | 313/307 |
| 2,943,225 A * | 6/1960 | Firth | | H01J 21/10 |
| | | | | 313/299 |
| 2,999,983 A * | 9/1961 | Stern | | G01R 31/2632 |
| | | | | 324/762.07 |
| 3,183,432 A * | 5/1965 | Pintell | | G05F 1/42 |
| | | | | 323/239 |
| 3,368,105 A * | 2/1968 | Shimada | | H04N 3/18 |
| | | | | 315/102 |
| 4,594,630 A * | 6/1986 | Rabinowitz | | H02H 9/02 |
| | | | | 361/13 |
| 4,642,518 A * | 2/1987 | Dard | | H01J 37/241 |
| | | | | 315/1 |
| 5,416,391 A * | 5/1995 | Correa | | H01T 9/00 |
| | | | | 307/106 |
| 5,682,067 A * | 10/1997 | Manley | | H01J 37/32027 |
| | | | | 204/192.12 |
| 10,840,893 B2 * | 11/2020 | Romanov | | H02M 1/44 |
| 2004/0135634 A1 * | 7/2004 | Grove | | H03F 1/30 |
| | | | | 330/290 |

(Continued)

*Primary Examiner* — Yusef A Ahmed
(74) *Attorney, Agent, or Firm* — Occhiuti & Rohlicek LLP

(57) ABSTRACT

An apparatus for providing electrical power to a load includes a voltage source, a check valve that is oriented to prevent current from flowing towards the load, a vacuum diode that includes a cathode and an anode separated by a gap, and a magnet. The cathode and the anode are coated with a corresponding ceramic that includes a titanate group bonded to one of strontium and nickel. The magnet is oriented to cause magnetic field lines that are parallel to a cathode ray that forms across the gap during operation of the vacuum diode. The load is connected between the voltage source and the check valve and the vacuum diode is connected between the check valve and the load such that electric current into the load includes a contribution from the cathode ray in the vacuum diode.

18 Claims, 2 Drawing Sheets

(56) References Cited

U.S. PATENT DOCUMENTS

| | | | |
|---|---|---|---|
| 2009/0134018 A1* | 5/2009 | Watanabe | C23C 16/4412 |
| | | | 204/298.03 |
| 2013/0154596 A1* | 6/2013 | Huang | H02M 3/156 |
| | | | 323/282 |
| 2018/0263090 A1* | 9/2018 | Perichon | H05B 45/3725 |
| 2021/0159800 A1* | 5/2021 | Romanov | H02M 3/33569 |
| 2022/0224248 A1* | 7/2022 | Sakakibara | H02M 1/0032 |
| 2024/0154540 A1* | 5/2024 | Lin | H02M 7/062 |

\* cited by examiner

POWER SUPPLY WITH VACUUM DIODE

BACKGROUND

Many modern devices include a load that is reliant on dc power. A power supply typically receives ac power and converts it into dc power for this purpose. This power conversion process relies in part on switching circuitry that introduces losses.

SUMMARY

In one aspect, the invention features a power supply for providing electrical power to a load. Such a power supply includes a voltage source, a controller, a check valve, cathode and anode sleeves, a vacuum diode, and a vacuum-diode magnet. The controller controls the voltage source, preferably using an artificial-intelligence module that has been trained to control the voltage source. The check valve is oriented to enforce unidirectional current in the load, for example by preventing current from flowing towards the load. The cathode and anode sleeves are made of a ceramic having high permittivity. Examples include a titanate group bonded to either a strontium atom or a nickel atom. The vacuum diode includes a vacuum-diode cathode and a vacuum-diode anode separated by a gap. The vacuum-diode cathode is inserted into the cathode sleeve and the vacuum-diode anode is inserted into the anode sleeve. The vacuum-diode magnet that is oriented to cause magnetic field lines that are parallel to a cathode ray that forms across the gap during operation of the vacuum diode. The load is connected between the voltage source and the check valve, and the vacuum diode is connected between the check valve and the load such that electric current into the load includes a contribution from the cathode ray in the vacuum diode. As a result of current pulsations caused by the controller, the cathode ray include clusters of coherent electrons.

Embodiments include those in which the check valve includes a semiconductor diode that is oriented to be reverse biased during operation of the power supply and those in which the check valve include series-connected semiconductor diodes.

Further embodiments include a vacuum triode disposed between the check valve and the vacuum diode, the vacuum triode including a triode anode connected to the vacuum-diode cathode, a triode cathode that includes a conducting filament connected to a voltage source, and a triode plate connected to the check valve. Among the embodiments that include the vacuum triode are those that also include a wire that connects the vacuum-diode cathode to the triode anode and a triode magnet that surrounds the wire. Also among the embodiments that include a vacuum triode are those in which a battery connects to the triode cathode and a capacitor is connected between a battery and the vacuum-diode anode, typically with an intervening capacitance. Still other embodiments that include a vacuum triode are those in which a cage provides electromagnetic shielding for the vacuum triode. In some embodiments, the triode cathode includes a filament having a first filament-terminal, a second filament-terminal, and an emission point between the first filament-terminal and the second filament-terminal. In such embodiments, the first and second filament terminals are connected to a voltage source and electrons are thermionically emitted from the emission point as a result of the voltage source.

Among the embodiments are those in which the cathode sleeve and/or the anode sleeve includes a ceramic in which the titanate group is bonded to strontium and those in which the cathode sleeve and/or the anode sleeve includes a ceramic in which the titanate group is bonded to nickel.

Still other embodiments include those in which the artificial-intelligence module has been trained to cause pulsations in current flow through the load and those in which the artificial-intelligence module has been trained to pulsations at a pulsation frequency configured to promote coherency in electrons in the cathode ray.

Among the embodiments are those in which the voltage source includes an inverter. Among these are embodiments in which the voltage source includes an ac power source that provides an output to the inverter. In such embodiments, the inverter provides a pulsating current to the load. This pulsating current includes pulses imposed by the controller. Also among the embodiments are those in which the inverter has positive terminal, which connects to the vacuum diode, and a negative terminal, which connects to the load.

In other embodiments, the voltage source includes a ground terminal to which the vacuum diode is connected. Among these are embodiments that include a vacuum triode having an anode connected to the cathode of the vacuum diode.

In some embodiments, the controller is connected to a junction between the load and the check valve. In other embodiments, the controller includes an artificial neural network that has been trained to cause the pulsations in the current.

In another aspect, the invention features an apparatus including a power supply for providing electrical power to a load. Such a power supply includes a voltage source connected to the load, a semiconductor diode oriented to enforce unidirectional current flow in the load, a vacuum diode that include means for causing a cathode ray in the vacuum diode to pass through a ceramic including a titanate group bonded to an atom of an element selected from the group consisting of strontium and nickel, means for causing a magnetic field having magnetic field lines that are parallel to the cathode ray that traverses the vacuum diode during operation thereof, and means for causing the cathode ray that traverses the vacuum diode to comprise clusters of coherent electrons, In such embodiments, the load is connected between the voltage source and the semiconductor diode and the vacuum diode is connected between the semiconductor diode and the load such that electric current into the load includes a contribution from the cathode ray in the vacuum diode.

In another aspect, the invention features a method that includes providing power to a load by connecting a power source to the load, causing pulsations in a current that the power source provides to the load, the pulsations being at a frequency selected to cause clusters of coherent electrons in a cathode ray that forms between an anode and a cathode of a vacuum diode, providing the current to the cathode of the vacuum diode, causing the cathode ray in the vacuum diode to pass through a ceramic that include a titanate group bonded to an atom of an element selected from the group consisting of strontium and nickel, imposing a magnetic field at the cathode ray in the vacuum diode, the magnetic field being directed along the cathode ray, and providing a current caused by the cathode ray at the anode to the power source.

Among the practices of the method are those that also include connecting an anode of a vacuum triode to the cathode of the vacuum diode and using the pulsations in the current to modulate a cathode ray that traverses the vacuum triode.

These and other features of the invention will be apparent from the following detailed description and the accompanying figures, in which:

DESCRIPTION

Figure 1:
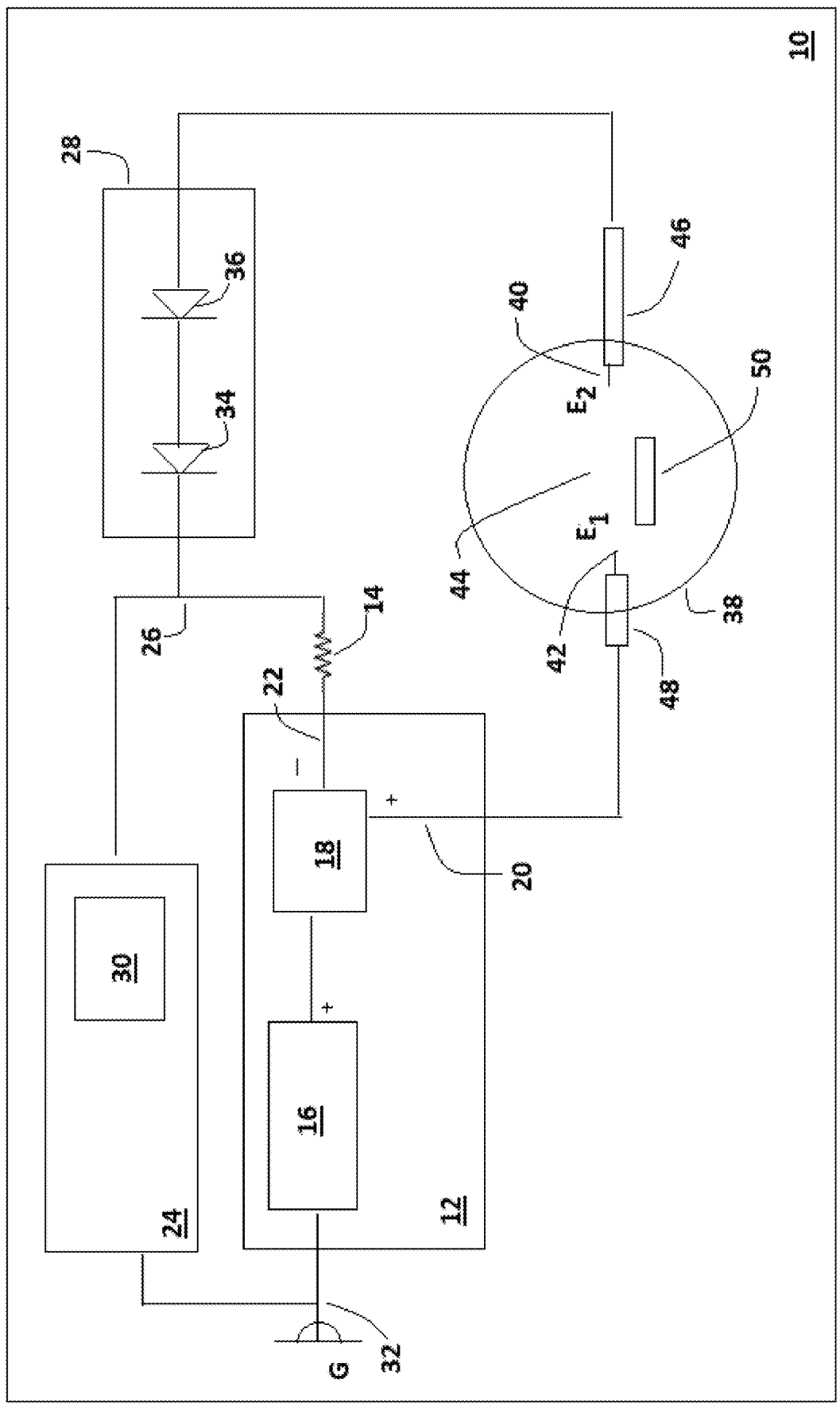
FIG. 1 shows a power supply having a vacuum diode.

FIG. 1 shows a power supply 10 having a voltage source 12 and a load 14. Examples of a load 14 include electric heaters, lamps, electrical appliances, and electrical chargers.

In the illustrated embodiment, the voltage source 12 comprises a transformer 16 that provides an AC voltage to an inverter 18. The inverter 18 is a high-voltage inverter that converts this AC voltage into a DC voltage of comparable amplitude. The inverter 18 features two output terminals: a positive terminal 20 and a negative terminal 22.

Also shown in FIG. 1 is a controller 24 that connects to a junction 26 between the load 14 and a check valve 28. The check valve 28 is oriented to cooperate in preventing current from flowing away from the load 14.

The controller 24 relies on a signal obtained at the junction 26 to control the time variation of voltage at the voltage source 12. In some embodiments, the controller 24 is implemented using an artificial-intelligence module 30, such as a neural network, that has been trained to modulate the time variation of the voltage provided by the voltage source 12 to the load 14. This, in turn, regulates the frequency of pulsations of unipolar current provided by the inverter 18.

The voltage source 12 includes three terminals: a ground terminal 32, the positive terminal 20, and the negative terminal 22. The negative terminal 22 connects to the load 14, which is in series with the check valve 28.

The check valve 28 includes at least a first semiconductor-diode 34 oriented with its cathode connected to the load 14. However, because the first semiconductor-diode 34 is susceptible to breakdown when reverse biased, it is often useful to have one or more additional semiconductor diodes in series with the first semiconductor-diode 34.

In the illustrated embodiment, the check valve 28 comprises a second semiconductor-diode 36. The anode of the first semiconductor-diode 34 connects to the cathode of the second semiconductor-diode 36. The number of semiconductor diodes 34, 36 depends on the maximum foreseeable voltage to be sustained by the check valve 28.

The power supply 10 also includes a vacuum diode 38. The vacuum diode 38 comprises a vacuum-diode cathode 40 and a vacuum-diode anode 42 that are separated by a gap in a vacuum chamber. A line that extends between the vacuum-diode cathode 40 and the vacuum-diode anode 42 defines an "axial direction." Suitable materials for use as the vacuum-diode cathode 40 and the vacuum-diode anode 42 are alloys of nickel and alloys of tungsten.

The vacuum-diode cathode 40 connects to the check valve 28, and in particular, to the anode of the second semiconductor-diode 36. The vacuum-diode anode 42 connects to the positive terminal 20 of the inverter 18. During operation, thermionic emission results in a cathode ray 44 forming along the axial direction.

It is particularly useful to seal the vacuum-diode cathode 40 inside a cathode sleeve 46 and to seal the vacuum-diode anode 42 inside an anode sleeve 48, both of which have been evacuated prior to being sealed. A suitable ceramic from which to make the cathode sleeve 46 and the anode sleeve 48 is one that has a high dielectric constant. Examples include those ceramics that comprise a titanate group, and in particular, a titanate group that comprises a titanium atom bonded to three oxygen atoms. Particularly preferable ceramics comprise those in which this titanate group is bonded to either barium or strontium to form a ceramic such as barium titanate or strontium titanate. In part as a result of their high dielectric constants, such ceramics interact with electrons in a manner that attenuates coulombic forces and thus promotes formation of a particularly compact cathode ray 44 that is particularly dense in electrons.

In some embodiments, the same ceramic is used for the anode sleeve 48 and the cathode sleeve 46. In other embodiments, the ceramic used in the anode sleeve 48 differs from that used in the cathode sleeve 46.

Since the phase of an electron defines its spatial location, electrons that are packed together tend to have essentially the same phase. This results in coherent chains of electrons. The coherency arises from the electrons' sharing a common or nearly common phase.

A vacuum-diode magnet 50 outside the vacuum diode 20 imposes a magnetic field that extends between the vacuum-diode cathode 40 and the vacuum-diode anode 42.

As a result, those electrons in the cathode ray 44 that move in a direction other than the axial direction experience a magnetic force that causes them to move in a helical trajectory whose radius depends inversely on the magnet's field strength. This tends to reduce the tendency of the cathode ray 44 to disperse and thus promotes high electron density within the cathode ray 44. In this way, the vacuum-diode magnet 50 helps the electrons stay in phase, thereby discouraging the coherent chains of electrons from breaking down. A suitable vacuum-diode magnet 50 is one that provides a field strength of two Tesla.

The vacuum-diode magnet 50, the cathode sleeve 46, and the anode sleeve 48 cooperate to cause the cathode ray 44 across the vacuum diode 38 to have a particularly high electron density. This is achieved in part by the ceramic material of the cathode sleeve 46 and the anode sleeve 48, both which promote formation of a narrow cathode ray 44, and the vacuum-diode magnet 50, whose lines of force act to suppress the cathode ray's tendency to disperse as it traverses the vacuum diode 20.

In operation, the artificial-intelligence module 30 modulates the time-derivative of the voltage such that the voltage's frequency varies between several megahertz and up to two hundred megahertz.

In operation, electrons from a utility's power grid enter the power supply 10 under the influence of a sinusoidally-varying electromotive force having an amplitude of one-hundred ten to two-hundred thirty volts, depending on local custom. The inverter 18 raises the potential energy of the electrons to be on the order of thousands of volts. These electrons then exit the negative terminal 22 and move into the load 14.

The controller 24, and in particular, the artificial-intelligence module 30, regulates the flow of these electrons by imposing pulses on what would otherwise be a direct current. The controller 24 controls the temporal interval between these pulses. In a typical embodiment, the artificial-intelligence module 30 causes the pulse frequency, i.e., the number of such pulsations per second, to be anywhere between several thousand pulsations per second to hundreds of millions of pulses per second.

After passing through the load 14, the electrons pass through the check valve 28, the purpose of which is to forbid electrons from changing their direction of travel. The resulting unipolar current enters the vacuum-diode cathode 40 of the vacuum diode 38. At the vacuum-diode cathode 40, the electrons, under the influence of the high voltage, have enough energy to free themselves from the surface of the metal. This results in free electrons that traverse the vacuum diode as a cathode ray 44.

This cathode ray 44 inevitably passes through the cathode sleeve 46. As it does so, it interacts with the high permittivity ceramic that forms the cathode sleeve 46. This interaction reduces the coulombic forces that would otherwise broaden the cathode ray 44. The result is a cathode ray 44 in which the electrons are made to stay close together, i.e., in phase, as a result of their interaction with the high permittivity ceramic.

As the cathode ray 44 crosses the vacuum diode 38, the vacuum-tube magnet 30 exerts a restoring force on electrons that stray from the path between the vacuum-diode anode 42 and the vacuum-diode cathode 40. As a result, the cathode ray 44 retains its compact nature. This promotes the electrons' ability to remain in phase as they cross the vacuum diode 38. Upon reaching the vacuum-diode anode 42, the electrons proceed to the positive terminal 20, thereby completing the circuit.

Figure 2:
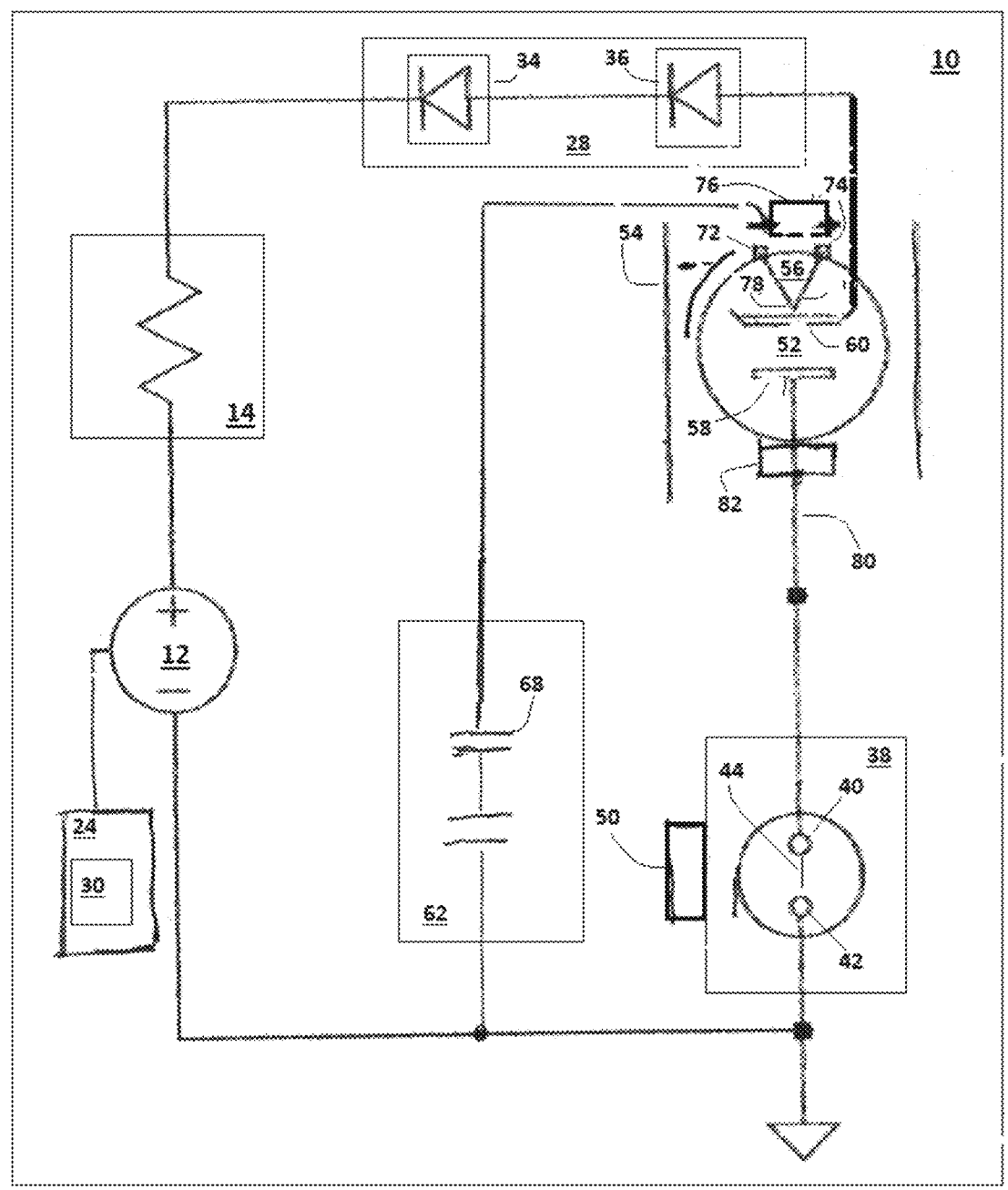
FIG. 2 shows a power supply similar to that shown in FIG. 1 but also including a vacuum triode.

FIG. 2 shows an alternative embodiment that incorporates a vacuum triode 52 between the check valve 28 and the vacuum diode 38. In this embodiment, the voltage source 12 is shown without its constituent elements, which are already shown in FIG. 1. In addition, the cathode sleeve 46 and the anode sleeve 48 have been omitted for clarity. In this embodiment, the vacuum-diode anode 42 connects instead to the ground terminal 32 instead of to the negative terminal 22.

A grounded metal cage 54 surrounds the vacuum triode 52 to suppress electromagnetic interference. A suitable material from which to make the cage 54 is copper. Preferably, the cage 54 is wound around an electrical insulator that surrounds the triode 52.

The triode 52 features a triode cathode 56 and a triode anode 58. The triode anode 58 connects to the vacuum diode 38, and the triode cathode 56 connects to a capacitance 62 that includes one or more capacitors 68 in series.

In addition, the triode 52 includes a triode plate 60 that connects to the check valve 28. This permits more efficient application of the pulsations imposed by the controller 24 to cause time-varying fluctuations in electron density of the cathode ray 44. This, in turn, causes the cathode ray 44 to harbor clusters of electrons that are in phase and clusters of electrons that are out of phase. The time-varying voltage is controlled by the artificial-intelligence module 30, which has been trained to respond to variations in such electrical parameters as voltage and current, for example, as a result of time-varying load variations.

The triode cathode 56 is formed by a filament 70 having a first filament-terminal 72 and a second filament-terminal 74 that are connected to corresponding terminals of a battery 76. A suitable material for such a filament 70 is tungsten metal.

Between the first filament-terminal 72 and the second filament-terminal 74 is an emission point 78. In operation, the battery 76 drives a current that heats the filament 70 to cause thermionic emission at the emission point 78. This results in a cathode ray that extends between the triode cathode 56 and the triode anode 58.

A wire 80 surrounded by a triode magnet 82 connects the triode anode 58 to the vacuum-diode cathode 40. The presence of the triode magnet 82 further promotes electron density.

In operation, charge from the check valve 28 arrives at the triode cathode 56. This charge is further enriched through thermionic emission from the filament 70. The charge travels to the triode anode 58 and eventually becomes part of the cathode ray 44 in the vacuum diode 38.

Having described the invention and a preferred embodiment thereof, what is claimed as new and secured by Letters Patent is:

1. An apparatus comprising a power supply for providing electrical power to a load, said power supply comprising:
    a voltage source,
    a controller for controlling said voltage source, said controller comprising an artificial-intelligence module trained to control said voltage source,
    a check valve that is oriented to prevent current from flowing towards said load,
    a cathode sleeve, said cathode sleeve comprising a titanate group bonded to an atom of an element selected from the group consisting of strontium and nickel,
    an anode sleeve, said anode sleeve comprising a titanate group bonded to an atom of an element selected from the group consisting of strontium and nickel,
    a vacuum diode that comprises a vacuum-diode cathode and a vacuum-diode anode separated by a gap, wherein said vacuum-diode cathode is inserted into said cathode sleeve, wherein said vacuum-diode anode is inserted into said anode sleeve,
    a vacuum-diode magnet that is oriented to cause magnetic field lines that are parallel to a cathode ray that forms across said gap during operation of said vacuum diode,
    a vacuum triode disposed between said check valve and said vacuum diode, said vacuum triode comprising a triode anode connected to said vacuum-diode cathode, a triode cathode that comprises a conducting filament connected to a second voltage source, and a triode plate connected to said check valve,
    a triode magnet and a wire, wherein said wire connects said vacuum-diode cathode to said triode anode of said vacuum triode and wherein said triode magnet surrounds said wire, and
    a cage that provides electromagnetic shielding for said vacuum triode,
    wherein, as a result of current pulsations caused by said controller, said cathode ray comprises clusters of coherent electrons,
    wherein said load is connected between said voltage source and said check valve, and
    wherein said vacuum diode is connected between said check valve and said load such that electric current flowing into said load includes a contribution from said cathode ray in said vacuum diode.

2. The apparatus of claim 1, wherein said check valve comprises a semiconductor diode that is oriented to be reverse biased during operation of said power supply.

3. The apparatus of claim 1, wherein said check valve comprises series-connected semiconductor diodes.

4. The apparatus of claim 1, wherein at least one of said cathode sleeve and said anode sleeve comprises a ceramic in which said titanate group is bonded to strontium.

5. The apparatus of claim 1, wherein at least one of said cathode sleeve and said anode sleeve comprises a ceramic in which said titanate group is bonded to nickel.

6. The apparatus of claim 1, wherein said artificial-intelligence module has been trained to cause pulsations in current flow through said load.

7. The apparatus of claim 1, wherein said artificial-intelligence module has been trained to cause pulsations in current flow, said pulsations being at a pulsation frequency configured to promote coherency in electrons in said cathode ray.

8. The apparatus of claim 1, wherein said vacuum triode comprises a capacitor and a battery, wherein said battery is connected to said triode cathode, and wherein said capacitor is connected between said battery and said vacuum-diode anode.

9. The apparatus of claim 1, wherein said voltage source comprises an inverter and an ac power source, wherein said ac power source provides an output to said inverter and wherein said inverter provides a pulsating current to said load, said pulsating current comprising pulses imposed by said controller.

10. The apparatus of claim 1, wherein said voltage source comprises an inverter having a negative terminal and a positive terminal, wherein said vacuum diode is connected to said positive terminal, and wherein said load is connected to said negative terminal.

11. The apparatus of claim 1, wherein said voltage source comprises a ground terminal and said vacuum diode is connected to said ground terminal.

12. The apparatus of claim 1, wherein said conducting filament has a first filament-terminal, a second filament-terminal, and an emission point between said first filament-terminal and said second filament-terminal, wherein said first and second filament terminals are connected to said second voltage source, and wherein electrons are thermionically emitted from said emission point as a result of said second voltage source.

13. The apparatus of claim 1, wherein said controller is connected to a junction between said load and said check valve.

14. The apparatus of claim 1, wherein said controller comprises an artificial neural network that has been trained to cause said current pulsations.

15. An apparatus comprising a power supply for providing electrical power to a load, said power supply comprising:
a voltage source,
a controller for controlling said voltage source, said controller comprising an artificial-intelligence module trained to control said voltage source,
a check valve that is oriented to prevent current from flowing towards said load,
a cathode sleeve, said cathode sleeve comprising a titanate group bonded to an atom of an element selected from the group consisting of strontium and nickel,
an anode sleeve, said anode sleeve comprising a titanate group bonded to an atom of an element selected from the group consisting of strontium and nickel,
a vacuum diode that comprises a vacuum-diode cathode and a vacuum-diode anode separated by a gap, wherein said vacuum-diode cathode is inserted into said cathode sleeve, wherein said vacuum-diode anode is inserted into said anode sleeve,
a vacuum-diode magnet that is oriented to cause magnetic field lines that are parallel to a cathode ray that forms across said gap during operation of said vacuum diode, and
a vacuum triode comprising a triode cathode, a capacitor, and a battery, wherein said vacuum triode is disposed between said check valve and said vacuum diode, wherein said battery is connected to said triode cathode, and wherein said capacitor is connected between said battery and said vacuum-diode anode,
wherein said voltage source comprises an inverter and an ac power source, wherein said ac power source provides an output to said inverter and wherein said inverter provides a pulsating current to said load, said pulsating current comprising pulses imposed by said controller,
wherein, as a result of current pulsations caused by said controller, said cathode ray comprises clusters of coherent electrons,
wherein said load is connected between said voltage source and said check valve, and
wherein said vacuum diode is connected between said check valve and said load such that electric current flowing into said load includes a contribution from said cathode ray in said vacuum diode.

16. The apparatus of claim 15, wherein said triode cathode comprises a conducting filament connected to said battery, and a triode plate connected to said check valve.

17. The apparatus of claim 15, further comprising a triode magnet and a wire, wherein said wire connects said vacuum-diode cathode to a triode anode of said vacuum triode and wherein said triode magnet surrounds said wire.

18. The apparatus of claim 15, further comprising a cage, wherein said vacuum triode comprises a triode anode that is connected to said vacuum-diode cathode and wherein said cage provides electromagnetic shielding for said vacuum triode.

* * * * *